United States Patent
Kurita et al.

(10) Patent No.: US 7,879,695 B2
(45) Date of Patent: Feb. 1, 2011

(54) THIN SILICON WAFER AND METHOD OF MANUFACTURING THE SAME

(75) Inventors: Kazunari Kurita, Tokyo (JP); Shuichi Omote, Tokyo (JP)

(73) Assignee: Sumco Corporation, Tokyo (JP)

( * ) Notice: Subject to any disclaimer, the term of this patent is extended or adjusted under 35 U.S.C. 154(b) by 100 days.

(21) Appl. No.: 12/422,401

(22) Filed: Apr. 13, 2009

(65) Prior Publication Data

US 2009/0256241 A1 Oct. 15, 2009

(30) Foreign Application Priority Data

Apr. 15, 2008 (JP) .............................. 2008-105781

(51) Int. Cl.
*H01L 21/00* (2006.01)

(52) U.S. Cl. ...................................... 438/476; 438/693

(58) Field of Classification Search ......... 438/471–477, 438/692–693
See application file for complete search history.

(56) References Cited

U.S. PATENT DOCUMENTS 5,478,436 A * 12/1995 Winebarger et al. ......... 438/693
5,734,195 A 3/1998 Takizawa et al.
5,874,348 A 2/1999 Takizawa et al.

FOREIGN PATENT DOCUMENTS

JP 6-338507 12/1994
JP 2006-313922 11/2006

OTHER PUBLICATIONS

English language Abstract of JP 6-338507, Dec. 6, 1994.
English language Abstract of JP 2006-313922, Nov. 16, 2006.

* cited by examiner

*Primary Examiner*—Richard A. Booth
(74) *Attorney, Agent, or Firm*—Greenblum & Bernstein, P.L.C.

(57) ABSTRACT

A method of manufacturing a thin silicon wafer by slicing a silicon single crystal includes: a thinning step S3 of polishing a rear surface of the silicon wafer to reduce the thickness of the silicon wafer after a device structure is formed on a front surface of the silicon wafer; a mirror surface forming step S4 of processing the rear surface of the silicon wafer into a mirror surface using a chemical mechanical polishing method; and a modifying step S5 of dispersing abrasive grains that are harder than those used to form the mirror surface in the mirror surface forming process and forming a damaged layer, serving as a gettering sink for heavy metal, on the rear surface of the silicon wafer using the chemical mechanical polishing method. The thickness T5$b$ of the damaged layer W5$b$ in a wafer depth direction is set by the chemical mechanical polishing method in the modifying step S5 to control the gettering capability of the damaged layer.

6 Claims, 5 Drawing Sheets

THIN SILICON WAFER AND METHOD OF MANUFACTURING THE SAME

BACKGROUND OF THE INVENTION

1. Field of the Invention

The present invention relates to a thin silicon wafer and a method of manufacturing the same, and more particularly, to a technique for polishing the rear surface of a silicon wafer, which is formed by a before process in a semiconductor device process, using a chemical mechanical polishing method for an after process in the semiconductor device process to give gettering capability to the thin silicon wafer.

Priority is claimed on Japanese Patent Application No. 2008-105781, filed Apr. 15, 2008, the content of which is incorporated herein by reference.

2. Description of Related Art

With the development of mobile phone and digital still camera techniques, the thickness of a semiconductor device package provided in the apparatus has been reduced.

Such a thin semiconductor device is manufactured by slicing a silicon single crystal pulled by, for example, a CZ (Czochralski) method into a silicon wafer and forming a circuit on the silicon wafer. When impurities, such as heavy metal, are mixed with the silicon wafer, the device characteristics significantly deteriorate.

It is certainly necessary to reduce the thickness of a device chip in order to reduce the thickness of the semiconductor device package.

However, there is a concern that impurities, such as heavy metal, will be mixed with a silicon wafer for an after process in a semiconductor device process, particularly, a thinning process of polishing the rear surface of the wafer to reduce the thickness of the wafer to about 50 μm. When impurities, such as heavy metal, are mixed with the silicon wafer, electrical characteristics of a device significantly deteriorate. Therefore, a technique for preventing the mixture of impurities, such as heavy metal, in the thinning process is needed.

In the related art, the following methods have been used to remove heavy metal from the silicon wafer: an IG (intrinsic gettering) method of forming an oxygen precipitate on a silicon wafer; and an EG (extrinsic gettering) method of forming a gettering site, such as backside damage, on the rear surface of a silicon wafer.

JP-A-6-338507 discloses a technique related to an IG process, and JP-A-2006-313922 discloses an example of the EG method (paragraph [0005]).

However, in the related art, the IG (intrinsic gettering) method is used in a process before the semiconductor device process (device manufacturing process), and requires a heat treatment temperature of 600° C. or more in order to remove heavy metal dispersed in the bulk of the silicon wafer. In general, during a thinning process, which is an after process in the semiconductor device process, the heat treatment temperature is equal to or lower than 400° C. Therefore, precipitation is not sufficiently performed, and it is difficult to sufficiently getter heavy metal.

In recent years, there has been a demand for a reduction in the thickness of a device. For example, the thickness of a device is reduced from 50 μm to 40 μm or less, for example, about 30 μm. When the thickness of the device is reduced to the above-mentioned range, most of the IG layer having a gettering effect is removed in the thinning process of the IG (intrinsic gettering) method according to the related art. Therefore, it is difficult to obtain sufficient gettering capability, which causes a defective device.

As such, it is difficult to use the gettering method, which is used in a before process in the semiconductor device process, in an after process in the semiconductor device process. Therefore, when heavy metal contamination occurs in the process after the semiconductor device process, it has a significantly adverse effect on the reliability test of a device after a molding process (product).

SUMMARY OF THE INVENTION

The present invention has been made in order to solve the above-mentioned problems, and an object of the present invention is to provide a thin silicon wafer and a method of manufacturing the same capable of reliably and simply removing heavy metal contamination occurring in a process after a semiconductor device process from an active region of a device and improving electrical characteristics of a device after a molding process.

According to an aspect of the present invention, there is provided a method of manufacturing a thin silicon wafer by slicing a silicon single crystal. The method includes: a thinning step of polishing a rear surface of the silicon wafer to reduce the thickness of the silicon wafer after a device structure is formed on a front surface of the silicon wafer; a mirror surface forming step of processing the rear surface of the silicon wafer into a mirror surface using a chemical mechanical polishing method; and a modifying step of dispersing abrasive grains that are harder than those used to form the mirror surface in the mirror surface forming process and forming a damaged layer, serving as a gettering sink for heavy metal, on the rear surface of the silicon wafer using the chemical mechanical polishing method. The thickness of the damaged layer in a wafer depth direction is set by the chemical mechanical polishing method in the modifying step to control the gettering capability of the damaged layer.

In the modifying step, the thickness of the damaged layer in the wafer depth direction may be set in the range of 50 nm to 200 nm.

In the modifying step, the average diameter of the abrasive grains may be in the range of 0.01 μm to 10 μm.

In the modifying step, the hardness of the abrasive grains may be in the range of 200 HV to 1000 HV.

In the thinning step, the thickness of the silicon wafer may be reduced to a value that is equal to or greater than 5 μm and equal to or less than 40 μm.

In the modifying step, the residual stress of the damaged layer may be set in the range of 5 to 200 Mpa.

According to another aspect of the present invention, a thin silicon wafer is manufactured by the manufacturing method according to the above-mentioned aspect.

In the present invention, a minute damaged layer, serving as a gettering sink, is formed on the rear surface of a thin silicon wafer that is subjected to chemical mechanical polishing using hard abrasive grains having a specific average size distribution. In contrast, in the related art, since the flexural strength of a wafer is lowered due to a damaged layer formed in a polishing process, the damaged layer is removed by chemical mechanical polishing (CMP). In this case, since the damaged layer is removed by CMP, the flexural strength of the wafer is improved. However, there is no gettering sink that prevents the occurrence of heavy metal contamination during the CMP process or the subsequent process thereof. Therefore, when heavy metal contamination occurs in a process after the CMP process, it is likely to have an adverse effect on the electrical characteristics of a device. In contrast, in the present invention, the damaged layer on the rear surface of a wafer is maintained in a range capable of maintaining the flexural strength, and it is possible to form gettering sinks capable of gettering heavy metal while preventing a wafer from being broken and cracked.

In addition, it is possible to obtain necessary gettering capability by setting the thickness of the damaged layer. Therefore, even when the thickness of a wafer is reduced in the thinning step and the thickness of a bulk including an oxygen precipitate, serving as a gettering sink is reduced to lower the effect of IG, the influence of heavy metal contamination occurring in the thinning step is reduced, and no defect occurs due to the heavy metal contamination. Therefore, it is possible to prevent device characteristics from deteriorating, and improve the yield of a device.

Therefore, according to the above-mentioned aspects of the present invention, it is possible to improve the gettering capability. Therefore, it is possible to provide a silicon wafer capable of reducing the influence of metal contamination. As a result, it is possible to solve the problems of high manufacturing cost and low manufacturing yield in the device process.

DETAILED DESCRIPTION OF THE INVENTION

According to an embodiment of the present invention, there is provided a silicon wafer manufactured from a silicon single crystal that is grown by a CZ method to have a carbon concentration in the range of $1.0 \times 10^{16}$ atoms/cm$^3$ to $1.0 \times 10^{17}$ atoms/cm$^3$ and an initial oxygen concentration in the range of $1.4 \times 10^{18}$ atoms/cm$^3$ to $1.6 \times 10^{18}$ atoms/cm$^3$. A device is formed on the surface of the silicon wafer, and the silicon wafer has a thickness that is greater than or equal to 5 μm and equal to or less than 40 μm.

In this embodiment, the oxygen concentration is measured by ASTM F121-1979.

A modifying process of the present invention may be a polishing process of polishing the surface of the silicon wafer and a CMP process using hard slurry that is made of colloidal silica, silicon crystal, or diamond-like carbon and has a hardness in the range of 200 HV to 1000 HV.

The device formed on the silicon wafer according to the present invention may be a memory device.

Hereinafter, a silicon wafer and a method of manufacturing the same according to an embodiment of the present invention will be described with reference to the accompanying drawings.

Figure 1:
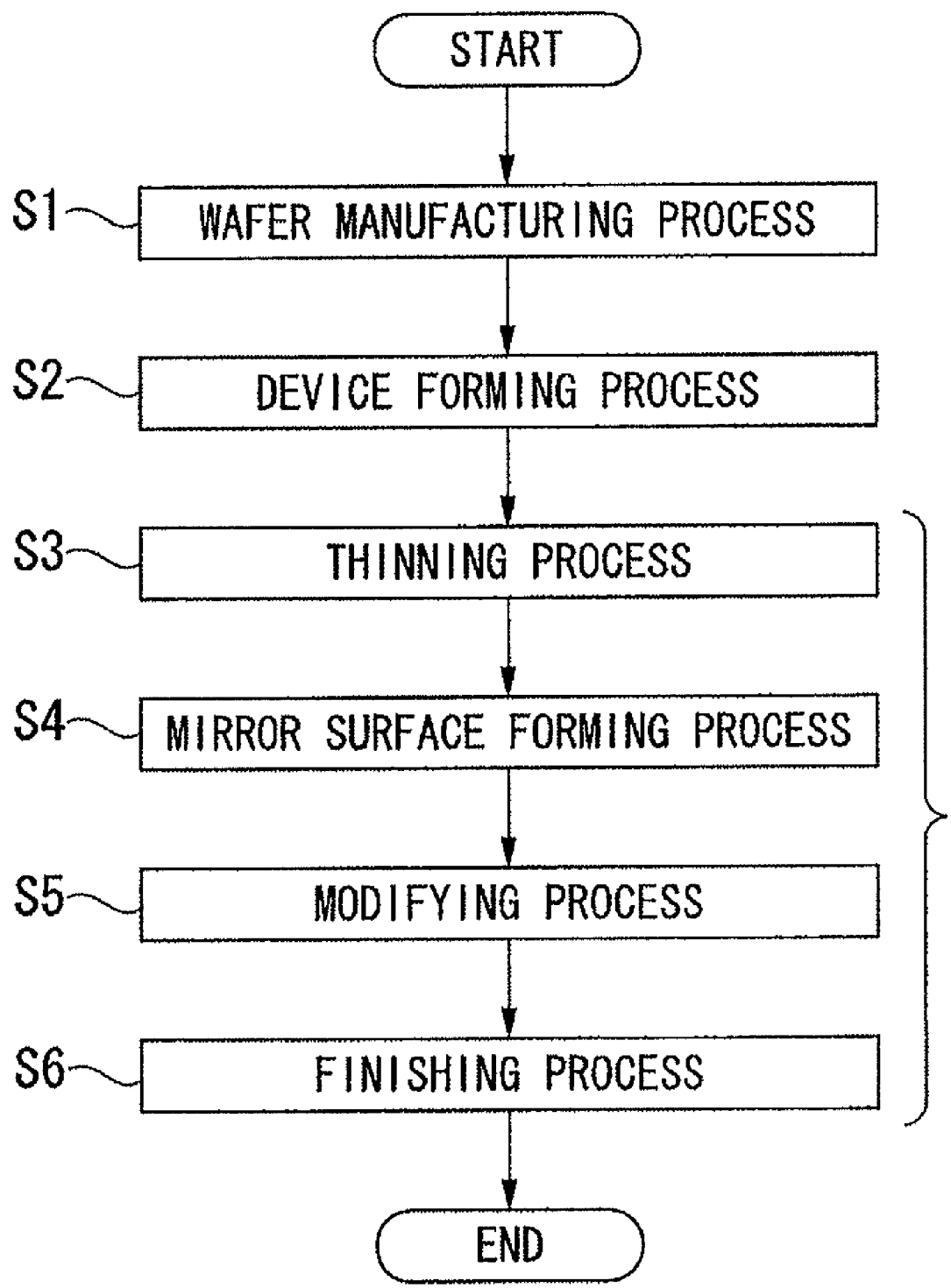
FIG. 1 is a flowchart illustrating a method of manufacturing a silicon wafer according to an embodiment of the present invention.

FIG. 1 is a flowchart illustrating a method of manufacturing a silicon wafer according to this embodiment, and FIGS. 2A to 2D are front cross-sectional views illustrating the silicon wafer in processes of the method of manufacturing a silicon wafer according to this embodiment. In the drawings, reference numeral W0 denotes a silicon wafer.

In this embodiment, a silicon wafer used to manufacture a memory device, which is an example of the device according to the present invention, will be described.

As shown in FIG. 1, the manufacturing method according to this embodiment includes a wafer manufacturing process S1, a device forming process S2, which is a process before a device process, a thinning process S3, which is a process after the device process, a mirror surface forming process S4, a modifying process S5, and a finishing process S6.

In this embodiment, first, as shown in the wafer manufacturing process S1 of FIG. 1, a silicon single crystal pulled by, for example, a CZ method is processed into a silicon wafer.

In the wafer manufacturing process S1, a general method is performed to process the silicon substrate (wafer). That is, a cutting apparatus, such as an ID saw or a wire saw, is used to slice the silicon single crystal to obtain a silicon wafer, annealing is performed on the silicon wafer, and surface treatments, such as polishing and cleaning, are performed on the silicon wafer. In addition to these processes, there are various processes, such as a process of forming an epitaxial layer on the surface of the silicon wafer, an ion injection process, wrapping, cleaning, and grinding, if necessary. The order of the processes may be changed, and the processes may be appropriately omitted for the purpose of use.

Figure 2A:
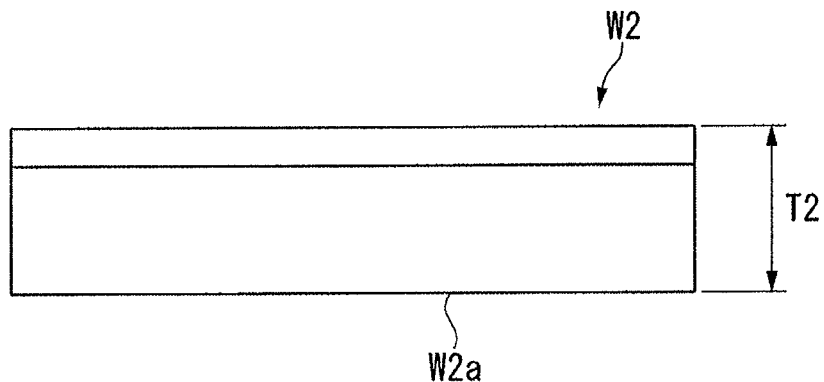
FIGS. 2A to 2D are front cross-sectional views illustrating the silicon wafer in processes of the method of manufacturing the silicon wafer according to the embodiment of the present invention.
Figure 2B:
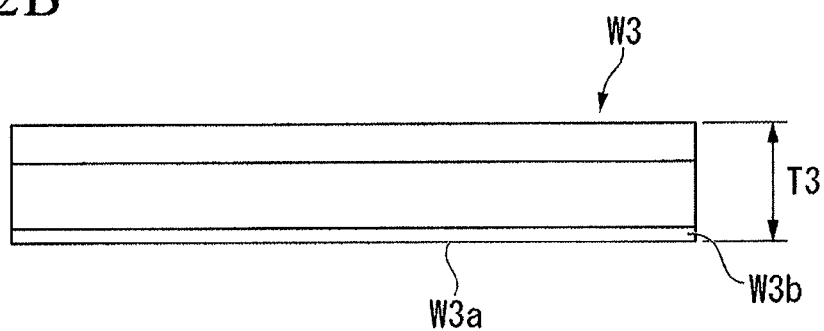

Then, in the device forming process S2 shown in FIG. 1, a device structure is formed on the surface of the silicon wafer processed in the wafer manufacturing process S1 to manufacture a silicon wafer W2. As shown in FIG. 2A, the silicon wafer W2 has a thickness T3 in the range of about 1000 to 500 μm, about 800 to 600 μm, or about 700 μm.

In the device forming process S2, a MOS-FET (metal-oxide semiconductor field-effect transistor) having a floating gate is formed to form a memory device portion or a device portion for a multi chip package (MCP), such as NAND-FLASH or NOR-FLASH having CMOS as a device structure, on the surface of the silicon wafer.

Figure 3:
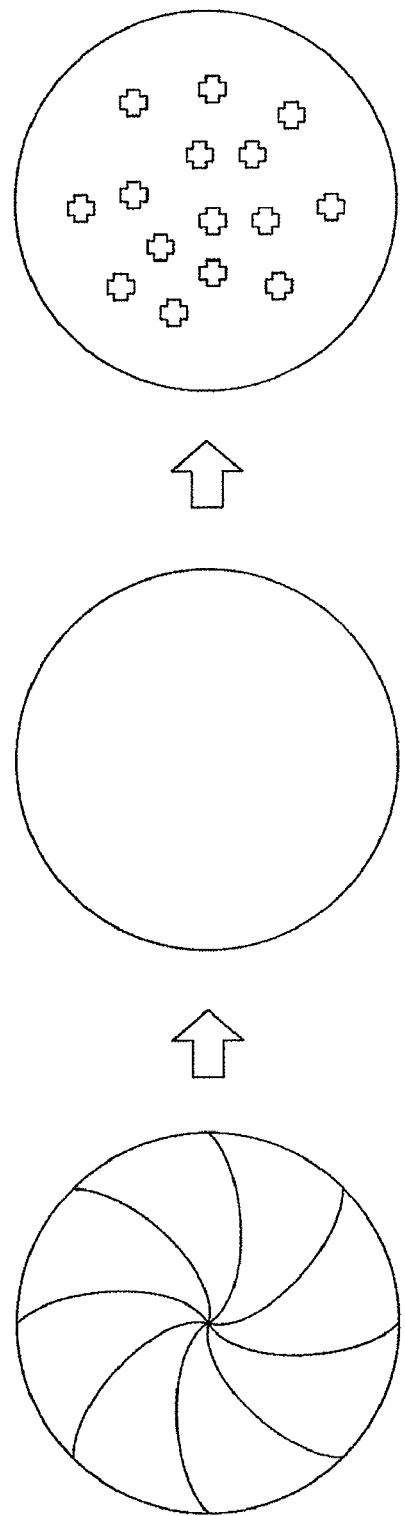
FIGS. 3 are diagrams illustrating rear surfaces observed by an optical microscope after polishing (thinning process), after chemical mechanical polishing (mirror surface forming process), and after chemical mechanical polishing using hard abrasive grains (modifying process), respectively.

Then, in the thinning process S3 shown in FIG. 1, polishing is performed on a rear surface W2a of the silicon wafer W2 to reduce the thickness of the silicon wafer. The thinning process S3 is a polishing process among the after processes in the device process, and polishes the rear surface W2a of the silicon wafer W2 having a thickness T2 shown in FIG. 2A to about 30 μm, thereby obtaining a wafer W3 having a thickness T3 shown in FIG. 2B. FIG. 3 schematically shows the state of the rear surface of the silicon wafer W3.

In this case, the following conditions can be set: a thickness T2 of 700 μm; a thickness T3 of 60 μm (50 to 80 μm); formation of a random damaged layer W3b on a rear surface W3a; and a roughness of the rear surface W3a of about 10 nm.

Figure 2C:
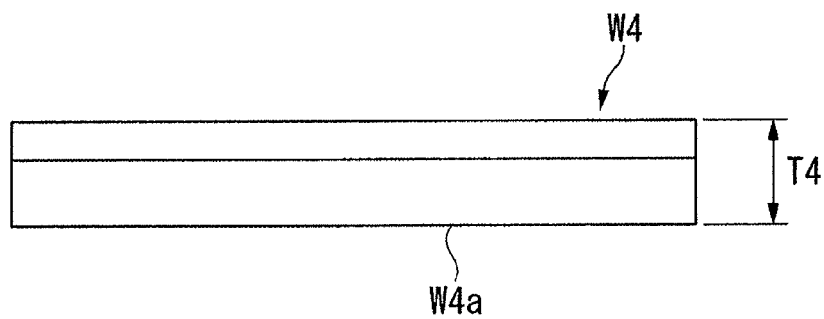

Then, as shown in FIG. 2C, in the mirror surface forming process S4 shown in FIG. 1, the rear surface W3a of the silicon wafer W3 is processed into a mirror surface W4a by a chemical mechanical polishing method, thereby obtaining a silicon wafer W4. FIG. 3B schematically shows the state of the rear surface of the silicon wafer W4.

In this case, the following conditions can be set: a thickness T4-T3 of 1 to 10 μm; an abrasive grain of about 100 HV to 500 HV; an abrasive grain material of $Al_2O_3$, SiC, or colloidal silica; and a grain diameter of 0.1 μm to 100 μm; a pressure of 100 g/cm$^2$ to 500 g/cm$^2$; a process time of about 10 to 60 seconds; and a roughness of the rear surface W4a about 0.1 to 2 nm.

Then, in the modifying process S5 shown in FIG. 1, abrasive grains that are harder than those used to form the polishing surface in the mirror surface forming process S4 are dispersed, and a damaged layer W5b, serving as a gettering sink for heavy metal, is formed on the rear surface W4a of the silicon wafer W4 by the chemical mechanical polishing method, thereby obtaining a silicon wafer W5. FIG. 3C schematically shows the state of the rear surface of the silicon wafer W5.

Figure 2D:
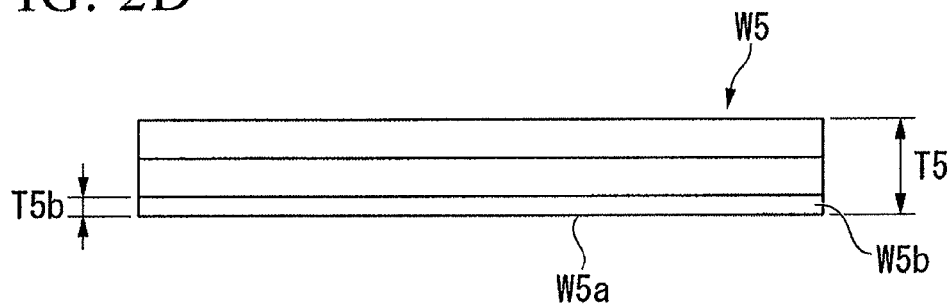

The chemical mechanical polishing (CMP) process uses slurry that is made of a hard material having a hardness of about 200 µV to 1000 HV, such as colloidal silica, silicon crystal, or diamond-like carbon, and includes abrasive grains having an average diameter of 0.01 µm to 10 µm to obtain the wafer W5 having a thickness T5 shown in FIG. 2D.

In this case, the following conditions are set: a thickness T5 of 30 µm; formation of a random damaged layer W5b on the rear surface W5a; and the state of the front surface: a roughness of about 5 nm.

The CMP process is performed on the silicon wafer on a plate made of alumina at a pressure of 100 g/cm$^2$ to 500 g/cm$^2$ for a process time of 10 to 60 seconds using slurry that includes 1 to 5 percent by weight of abrasive grains made of colloidal silica, silicon crystal or diamond-like carbon, and having a hardness of about 200 HV to 1000 HV and a particle diameter of about 10 to 100 nm.

In this way, the silicon wafer W5 has a thickness that is greater than or equal to 40 µm and equal to or less than 50 µm, and the damaged layer W5b having a thickness T5b in the range of 50 nm to 200 nm and preferably a thickness T5b of about 100 nm or less in a wafer depth direction is formed on the rear surface W5a of the silicon wafer w5. A residual stress of 5 Mpa to 200 Mpa occurs in the damaged layer W5b, and the damaged layer can show an extrinsic gettering effect. In this case, as the surface state of the rear surface W5a, the rear surface W5a has a roughness of about 5 nm, at which no breaking or cracking occurs.

In this case, the residual stress is measured by a Raman microscope using a cross-section incident method.

In the modifying process S5 according to this embodiment, the thickness T5b of the damaged layer W5b in the wafer depth direction is set to control the gettering capability of the damaged layer W5b.

Specifically, it is possible to control the gettering capability by adjusting the grain diameter of a slurry and polishing pressure to adjust the thickness T5b of the damaged layer W5b and the residual stress of the damaged layer W5.

When Ni or Cu is a contamination source, it is possible to reduce an initial contamination level of about $1 \times 10^{12}$ atoms/cm$^2$ to $1 \times 10^{13}$ atoms/cm$^2$ to a detection limit (Ni: $1 \times 10^{10}$ atoms/cm$^2$, and Cu: $1 \times 10^9$ atoms/cm$^2$). Similarly, since a process is completed with the texture of the rear surface being controlled, it is possible to prevent a silicon wafer from being broken or cracked. As a result, it is possible to obtain a silicon wafer having high device characteristics and high manufacturing yield.

Figure 4:
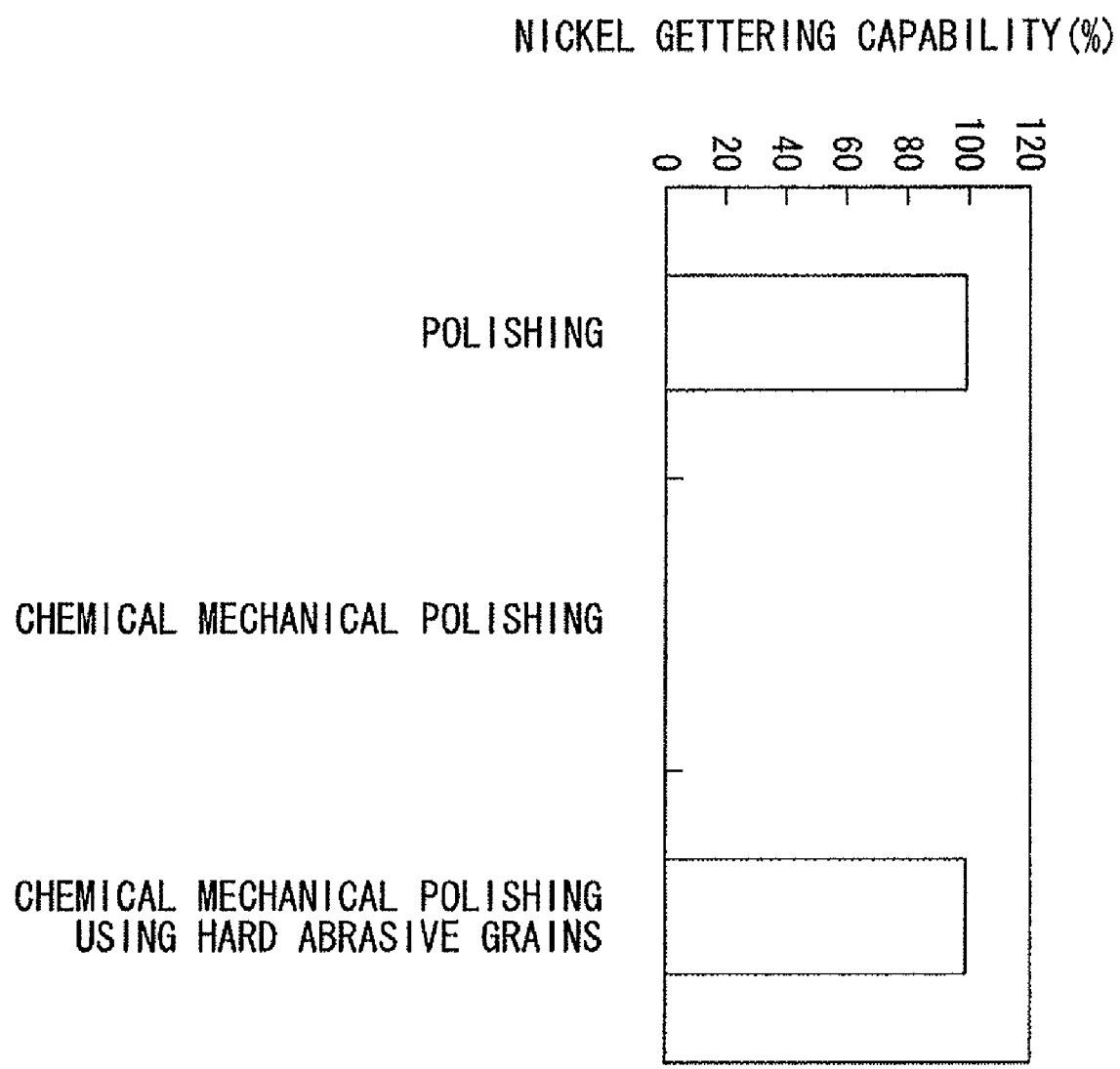
FIG. 4 is a graph illustrating the evaluation results of nickel gettering capability after various processes are performed on the rear surface.

As shown in FIG. 4, nickel gettering capabilities are different from each other after various surface treatments are performed on the rear surface.

According to the modifying process S5, the wafer W5 subjected to the chemical mechanical polishing process using hard abrasive grains has the same gettering capability as that after the rear surface is polished in the thinning process S3.

Therefore, in a process after the device process, it is possible to maintain the same gettering capability as that of a polished surface while maintaining the flexural strength of a chip. As a result, it is possible to improve the yield of a device in a chip assembly process.

Figure 5:
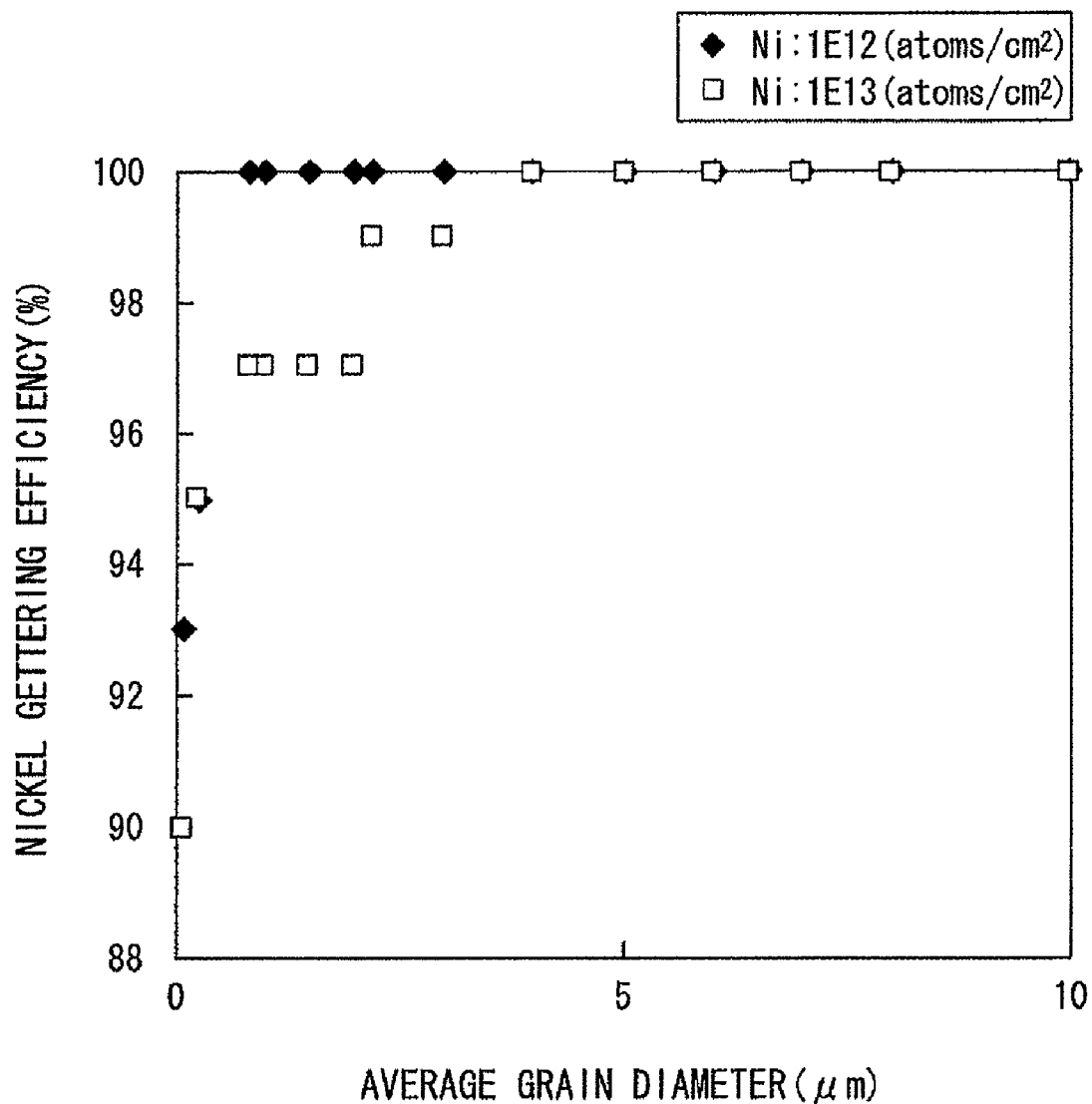
FIG. 5 is a graph illustrating the relationship between gettering capability and the diameter of an abrasive grain in CMP.

FIG. 5 shows the comparison between the distribution of the average size of hard abrasive grains and nickel gettering capability when a damaged layer is formed on the rear surface using an initial surface contamination concentration as a parameter.

From the result of the comparison, in this embodiment, it is possible to control gettering capability by setting the average size of the hard abrasive grains to the above-mentioned range and controlling the damage depth T5b of the damaged layer W5b in a process of manufacturing a thin semiconductor chip and a thin silicon wafer. Therefore, even when heavy metal contamination occurs in the subsequent process (assembly process), it is possible to remove heavy metal and improve the yield of a device.

In this embodiment, only the damaged layer W5b is formed by an extrinsic gettering method. However, an IG (intrinsic gettering) method and the extrinsic gettering method may be simultaneously performed to improve gettering capability. For example, any of the following methods may be used: a method of doping a silicon single crystal with carbon during a pulling process; a method of increasing the concentration of boron (B), which is a dopant, in the case of a p-type wafer; and a method of setting the initial concentration Oi of oxygen dissolved in silicon in a predetermined range.

In this embodiment, in order to obtain a p-type silicon single crystal including boron, carbon is added to a raw material to make a carbon-added raw material, and a silicon single crystal is produced from the carbon-added raw material. Then, the oxygen concentration Oi of the silicon single crystal is controlled to pull the silicon single crystal. Next, the pulling of the carbon-added CZ silicon single crystal will be described. A wafer having a diameter of 300 mm will be described, but the present invention is not limited thereto.

Next, a method of setting operation conditions for growing the carbon-added CZ silicon single crystal will be described.

First, high-purity polycrystal silicon is put into a crucible, and a boron (B) dopant is added such that the resistivity of a crystal becomes a p– type.

In this embodiment of the present invention, p+ boron (B) concentration corresponds to a resistivity in the range of 8 mΩcm to 10 mΩcm, and p boron concentration corresponds to a resistivity in the range of 0.1 to 100 Ωcm. In addition, p– boron concentration corresponds to a resistivity in the range of 0.1 Ωcm to 0.01 Ωcm.

In addition, a p/p– type means a wafer having a p-type epitaxial layer formed on a p– wafer.

A dopant is added to a silicon melt such that carbon concentration is in a predetermined range. In addition, for example, a crystal rotation speed, a crucible rotation speed, heating conditions, magnetic field conditions, and a pulling speed are controlled to obtain a predetermined oxygen concentration. The concentration of boron (B) may be a p-type, the carbon concentration may be in the range of $1.0 \times 10^{16}$ to $1.6 \times 10^{17}$ atoms/cm$^3$, and the oxygen concentration may be in the range of $1.4 \times 10^{18}$ to $1.6 \times 10^{18}$ atoms/cm$^3$.

The internal pressure of a CZ furnace is set in the range of 1.33 to 26.7 kPa (10 to 200 torr), which is a reduced pressure range, in an inert gas atmosphere. In addition, 3 to 20 percent by volume of hydrogen gas is mixed with an inert gas (for example, Ar gas) and the mixed gas is introduced into the furnace. The pressure is 1.33 kPa (10 torr) or more, preferably in the range of 4 to 26.7 kPa (30 to 200 torr), and more preferably in the range of 4 to 9.3 kPa (30 to 70 torr). When tie partial pressure of hydrogen is lowered, the concentration of hydrogen in the melt and crystal is lowered. Therefore, the lower limit of the pressure is defined in order to prevent the lowering of the hydrogen concentration.

When the internal pressure of the furnace is increased, a gas flow rate on the melt of an inert gas, such as Ar, is lowered. Then, a reactant gas, such as carbon degassed from a carbon heater or a carbon member or SiO evaporated from a melt, is not easily exhausted, and the concentration of carbon in crystal is higher than a desired value. In addition, SiO is agglutinated on an inner portion of the furnace that is above the melt and has a temperature of about 1100° C. or less, and dust is generated and falls into the melt. As a result, a crystal dislocation occurs. Therefore, the upper limit of the pressure is defined in order to prevent the crystal dislocation.

Then, silicon is heated and melted by a heater of the CZ furnace to obtain a melt. Then, a seed crystal held by a seed chuck is immersed in the melt, and the crucible and a pulling shaft are rotated to pull a crystal. Any one of {100}, {111}, and {110}-oriented crystals are used, and seed-narrowing is performed to remove the crystal dislocation. Then, a shoulder portion is formed, and the shoulder portion is changed to obtain a target body diameter of, for example, 310 mm.

Thereafter, a body portion having a diameter of, for example, 1200 mm is grown at a constant pulling speed, and the body portion is compressed under the normal conditions. Then, tail-narrowing is performed, and the crystal growth operation is completed. In this case, the pulling speed is appropriately determined depending on, for example, resistivity, the diameter of a silicon single crystal, or the hot zone structure (thermal environment) of the single crystal pulling apparatus used. For example, qualitatively, a pulling speed including the range in which an OSF ring is generated in a single crystal plane can be used. The lower limit of the pulling speed may be equal to or higher than the pulling speed that generates the OSF ring region in the single crystal plane but does not generate a dislocation cluster.

The concentration of hydrogen in the inert atmosphere may be equal to or higher than 3% and equal to or lower than 20% with respect to the internal pressure of the furnace in the range of 4.0 to 9.33 kPa (30 to 70 torr). The internal pressure of the furnace is equal to or higher than 1.33 kPa (10 torr), preferably in the range of 4.0 to 26.7 kPa (30 torr to 200 torr), and more preferably in the range of 4.0 to 9.3 kPa (30 torr to 70 torr). When the partial pressure of hydrogen is lowered, the concentration of hydrogen in a melt and crystal is lowered. Therefore, the lower limit of the pressure is defined in order to prevent the lowering of the hydrogen concentration.

When the internal pressure of the furnace is increased, a gas flow rate on the melt of an inert gas, such as Ar, is lowered. Then, a reactant gas, such as carbon degassed from a carbon heater or a carbon member or SiO evaporated from a melt, is not easily exhausted, and the concentration of carbon in crystal is higher than a desired value. In addition, SiO is agglutinated on an inner portion of the furnace that is above the melt and has a temperature of about 1100° C. or less, and dust is generated and falls into the melt. As a result, crystal dislocation occurs. Therefore, the upper limit of the pressure is defined in order to prevent the crystal dislocation. It is preferable that the partial pressure of hydrogen be equal to or higher than 40 Pa and equal to or lower than 400 Pa.

When silicon growth is performed in an inert atmosphere including hydrogen, the concentration of hydrogen in the silicon single crystal can be controlled by the partial pressure of hydrogen in the atmosphere. When hydrogen is introduced into a crystal, hydrogen in the atmosphere is dissolved in a silicon melt and becomes a normal (equilibrium) state. In addition, when hydrogen is agglutinated to a crystal, hydrogen concentrations in a liquid phase and a solid phase are distributed by concentration segmentation.

The concentration of hydrogen in a melt is determined depending on the partial pressure of hydrogen in a gas phase by Henry's law. The concentration of hydrogen in the crystal immediately after congelation can be controlled to a desired constant value in the axial direction of the crystal by controlling the partial pressure of hydrogen in the atmosphere.

According to the silicon single crystal growing method, since a silicon single crystal is pulled in an inert atmosphere including hydrogen, COP and a dislocation cluster are not included in the entire region in the diametric direction of a crystal. In addition, since the silicon single crystal is pulled while widening the range of a PI region pulling speed capable of pulling a single crystal in an interstitial silicon-dominated region (PI region), a straight portion of the single crystal can become the interstitial silicon-dominated region (PI region) without a dislocation cluster. Furthermore, according to the silicon single crystal growing method, the width of the OSF ring is reduced. In the related art, when a grown-in defect-free single crystal is pulled, the PI region pulling speed needs to be set in a very narrow range. However, in this embodiment, it is possible to very easily grow a grown-in defect-free single crystal at a pulling speed that is higher than that in the related art. In addition, when a silicon single crystal is pulled under the conditions that an OSF ring region is generated in the crystal plane, it is possible to decrease the width of the OSF ring and reduce the influence of the OSF ring.

In the embodiment, the PI region pulling speed range in a hydrogen atmosphere is compared with that in an inert atmosphere without hydrogen under the conditions that the value of a temperature gradient G in the axial direction of a crystal immediately after congelation does not vary.

Specifically, in the hydrogen atmosphere, the PI region pulling speed range capable of pulling a grown-in defect-free single crystal that is composed of an interstitial-silicon-type grown-in defect-free region (PI region) is four times or more that in the atmosphere without hydrogen. In addition, in the hydrogen atmosphere, the pulling speed has a margin that is 4.5 times that in the atmosphere without hydrogen. Therefore, the above-mentioned pulling speed range makes it possible to pull a desired single crystal.

In this case, it is possible to reduce the region in which the OSF ring is generated. In addition, the size of a PV region (vacancy-type grown-in defect-free region) does not vary by the addition of hydrogen.

In this embodiment, as described above, the addition of hydrogen makes it easy to pull a grown-in defect-free single crystal, and the addition of carbon makes it possible to reduce the influence of the OSF ring. Therefore, when an epitaxial layer is grown on the wafer, defects caused by the OSF ring can be reduced by the synergistic effect of the addition of hydrogen and the addition of carbon. Therefore, it is possible to pull a single crystal having a desired quality. As a result, an operating efficiency is improved, and it is possible to significantly reduce the manufacturing cost of a silicon single crystal or a silicon wafer manufactured from the silicon single crystal.

Since carbon in a solid solution state is included in silicon, carbon is introduced into a silicon lattice so as to be substituted for silicon. That is, the radius of a carbon atom is smaller than that of a silicon atom. Therefore, when carbon is disposed at a substitution position, the stress field of a crystal becomes a compression stress field, and interstitial oxygen and impurities are likely to be gettered in the compression stress field. For example, in the device process, a high-density oxygen precipitate involving dislocation is likely to be generated from carbon at the substitution position, and it is possible to give a high gettering effect to a silicon wafer W0. In this way, it is possible to obtain sufficient gettering capability in the device forming process S2, which will be described below.

It is necessary to regulate the concentration of carbon added in the above-mentioned range. The reason is that, if the carbon concentration is lower than the above-mentioned range, the formation of an oxygen/carbon-based precipitate is not accelerated and the above-mentioned high-density oxygen/carbon-based precipitate is not formed.

On the other hand, if the carbon concentration is higher than the above-mentioned range, the formation of an oxygen/carbon-based precipitate is accelerated, and a high-density oxygen/carbon-based precipitate is obtained. When the size of the precipitate is regulated, strain around the precipitate tends to be reduced. Therefore, the effect of strain is reduced, and the effect of gettering impurities is reduced.

Furthermore, it is necessary to regulate the oxygen concentration in the silicon wafer in the above-mentioned range. The reason is that, if the oxygen concentration is lower than the above-mentioned range, the formation of a carbon/oxygen-based precipitate is not accelerated and the above-mentioned high-density precipitate is not obtained.

On the other hand, if the oxygen concentration is higher than the above-mentioned range, the size of an oxygen precipitate is decreased, and the effect of strain in an interface between a maternal silicon atom and a precipitate is reduced. As a result, a gettering effect due to strain is reduced.

The formation of a complex defect due to boron, carbon, and oxygen is accelerated by the influence of the precipitate by increasing the concentration of boron.

In addition, mirror processing is performed on the surface of the silicon wafer, which is a carbon-added CZ crystal, and RCA cleaning, which is a combination of, for example, SC1 and SC2, is performed on the silicon wafer. Then, the silicon wafer is put into an epitaxial growth furnace in order to grow an epitaxial layer, and various CVD (chemical vapor deposition) methods are used to grow an epitaxial layer having, for example, a p-type boron (B) concentration. Then, a p/p-silicon wafer is supplied to a device manufacturing process.

In this case, the silicon wafer supplied to the device manufacturing process is a CZ crystal including boron and solute carbon. An oxygen precipitate nucleus or an oxygen precipitate formed during crystal growth is shrunken by a heat treatment when epitaxial growth is performed. Therefore, the oxygen precipitate formed in the silicon wafer in the stage of the silicon wafer is not observed by an optical microscope.

Therefore, in order to ensure gettering sinks for gettering heavy metal, after the epitaxial layer is grown, it is necessary to perform a low-temperature heat treatment at a temperature of about 600 to 800° C. capable of accelerating the formation of a precipitate for a process time of 0.25 to 3 hours to deposit a boron/carbon/oxygen-based precipitate W07 from carbon at a substitution position.

In the present invention, the boron/carbon/oxygen-based precipitate means a complex (cluster) including boron and carbon.

If the silicon wafer including solute carbon is used as a base material, the oxygen precipitate is spontaneously precipitated from the entire silicon wafer during a process before the device process. Therefore, it is possible to form gettering sinks having high gettering capability for heavy metal contamination over the entire thickness of the silicon wafer from immediately below the epitaxial layer in a process after the device process. As a result, gettering is performed near the epitaxial layer.

In order to achieve the gettering, it is preferable that the oxygen precipitate (BMD) W07, which is a boron/carbon/oxygen-based complex, have a size in the range of 10 to 100 nm and the density thereof in the silicon wafer W0 be in the range of $1.0 \times 10^6$ to $1.0 \times 10^{11}$ BMDs/cm$^3$.

In this case, the BMD size means the length of the diagonal line of a precipitate in the cross-sectional TEM image of the silicon wafer in the thickness direction, and indicates the average value of the precipitates in an observation field.

If the size of the oxygen precipitate is equal to or greater than the lower limit of the above-mentioned range, it is possible to increase the probability of gettering interstitial impurities (for example, heavy metal) using the effect of strain occurring in an interface between a maternal silicon atom and the oxygen precipitate. On the other hand, if the size of the oxygen precipitate is equal to or greater than the above-mentioned range, the strength of the wafer is lowered or dislocation occurs in the epitaxial layer, which is not preferable.

It is preferable that the density of the oxygen precipitate in the silicon wafer be in the above-mentioned range since the gettering of heavy metal in the silicon crystal depends on strain occurring in an interface between the maternal silicon atom and the oxygen precipitate and an interface level density (volume density).

When the above-mentioned heat treatment is performed before the device manufacturing process, it is preferable that the heat treatment be performed at a temperature of 600° C. to 800° C. for a time of 0.25 to 3 hours in a mixed atmosphere of oxygen and an inert gas, such as argon or nitrogen. The heat treatment makes it possible to give an IG (gettering) effect to the silicon wafer. In this case, the heat treatment is not necessarily performed on the high-concentration boron wafer, but it may be omitted.

If the heat treatment for giving the IG effect is performed at a temperature lower than the above-mentioned temperature range regardless of when the device manufacturing process is performed, a complex of boron, carbon, and oxygen is insufficiently formed. When metal contamination occurs in the wafer, it is difficult to obtain sufficient gettering capability, which is not preferable. On the other hand, if the heat treatment is performed at a temperature that is higher than the above-mentioned temperature range, an excessively large amount of oxygen precipitate is agglutinated. As a result, the density of the gettering sinks is insufficient, which is not preferable.

The temperature and the process time of the heat treatment may be changed as long as the same precipitation effect as that under the conditions of a temperature of 600° C. and a process time of 30 minutes can be obtained. The temperature and the process time of the heat treatment may be changed as long as the same precipitation effect as that under the conditions of a temperature of 800° C. and a process time of 4 hours can be obtained.

In addition, in the wafer manufacturing process, it is possible to pull a silicon single crystal ingot having a p+ boron (B) concentration, and it is possible to obtain an epitaxial layer having a p carbon concentration and the p/p+ silicon wafer W3.

In the thinning process S3, it is possible to reduce the thickness T5 to about 40 μm. The mirror surface forming process S4 may be performed after the modifying process S5.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of manufacturing a thin silicon wafer by slicing a silicon single crystal, comprising:
   a thinning step of polishing a rear surface of the silicon wafer to reduce the thickness of the silicon wafer after a device structure is formed on a front surface of the silicon wafer;
   a mirror surface forming step of processing the rear surface of the silicon wafer into a mirror surface using a chemical mechanical polishing method; and
   a modifying step of dispersing abrasive grains that are harder than those used to form the mirror surface in the mirror surface forming process and forming a damaged layer, serving as a gettering sink for heavy metal, on the rear surface of the silicon wafer using the chemical mechanical polishing method,
   wherein the thickness of the damaged layer in a wafer depth direction is set by the chemical mechanical polishing method in the modifying step to control the gettering capability of the damaged layer.

2. The method of manufacturing a thin silicon wafer according to claim 1,
   wherein, in the modifying step, the thickness of the damaged layer in the wafer depth direction is set in a range of 50 nm to 200 nm.

3. The method of manufacturing a thin silicon wafer according to claim 1,
   wherein, in the modifying step, the average diameter of the abrasive grains is in a range of 0.01 μm to 10 μm.

4. The method of manufacturing a thin silicon wafer according to claim 1,
   wherein, in the modifying step, the hardness of the abrasive grains is in a range of 200 HV to 1000 HV.

5. The method of manufacturing a thin silicon wafer according to claim 1,
   wherein, in the thinning step, the thickness of the silicon wafer is reduced to a value that is equal to a greater than 5 μm and equal to or less than 40 μm.

6. The method of manufacturing a thin silicon wafer according to claim 1,
   wherein, in the modifying step, the residual stress of the damaged layer is set in a range of 5 to 200 Mpa.

* * * * *